US012588428B2

(12) United States Patent
Seidel et al.

(10) Patent No.: US 12,588,428 B2
(45) Date of Patent: Mar. 24, 2026

(54) STRUCTURE AND METHOD FOR MEMORY ELEMENT TO CONFINE METAL WITH SPACER

(71) Applicant: GlobalFoundries U.S. Inc., Malta, NY (US)

(72) Inventors: Robert Viktor Seidel, Dresden (DE); Suk Hee Jang, Singapore (SG); Anastasia Voronova, Dresden (DE); Young Seon You, Singapore (SG)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 625 days.

(21) Appl. No.: 18/046,170

(22) Filed: Oct. 13, 2022

(65) Prior Publication Data

US 2024/0130255 A1      Apr. 18, 2024

(51) Int. Cl.
*H10N 70/00*          (2023.01)
*H10B 63/00*          (2023.01)
*H10N 70/20*          (2023.01)

(52) U.S. Cl.
CPC ........... *H10N 70/828* (2023.02); *H10B 63/80* (2023.02); *H10N 70/011* (2023.02); *H10N 70/24* (2023.02); *H10N 70/826* (2023.02)

(58) Field of Classification Search
CPC .............................. H10N 70/826; H10B 63/80
See application file for complete search history.

(56) References Cited

U.S. PATENT DOCUMENTS

| | | | |
|---|---|---|---|
| 8,772,888 | B2 | 7/2014 | Jung et al. |
| 9,257,642 | B1 | 2/2016 | Chang et al. |
| 9,373,782 | B2 | 6/2016 | Li et al. |
| 2005/0146927 | A1 | 7/2005 | Costrini |
| 2021/0098685 | A1 | 4/2021 | Liou et al. |

(Continued)

FOREIGN PATENT DOCUMENTS

| | | |
|---|---|---|
| KR | 1020170085411 A | 7/2017 |
| KR | 1020170122660 A | 11/2017 |

(Continued)

OTHER PUBLICATIONS

Examination Report for corresponding EP Application No. 23190756. 9-1211 dated Jan. 30, 2025, 6 pages.

(Continued)

*Primary Examiner* — Mark V Prenty
(74) *Attorney, Agent, or Firm* — Yee Tze Lim; Hoffman Warnick LLC

(57) ABSTRACT

The disclosure provides a structure and method for a memory element to confine a metal (e.g., a remaining portion of a metallic residue) with a spacer. A structure according to the disclosure includes a memory element over a first portion of an insulator layer. A portion of the memory element includes a sidewall over the insulator layer. A spacer is adjacent the sidewall of the memory element and on the first portion of the insulator layer. A metal-dielectric layer is within an interface between the spacer and the sidewall or an interface between the spacer and the first portion of the insulator layer. The insulator layer includes a second portion adjacent the first portion, and the second portion does not include the memory element, the spacer, and the metal-dielectric layer thereon.

18 Claims, 6 Drawing Sheets

(56)     References Cited

U.S. PATENT DOCUMENTS

| | | | |
|---|---|---|---|
| 2021/0104671 | A1 | 4/2021 | Song et al. |
| 2021/0384204 | A1 | 12/2021 | Cai et al. |
| 2024/0130255 | A1* | 4/2024 | Seidel ................. H10N 70/828 |

FOREIGN PATENT DOCUMENTS

| | | | |
|---|---|---|---|
| KR | 1020210045272 A | 4/2021 |
| TW | 201904022 A | 1/2019 |
| TW | 202209564 A | 3/2022 |

OTHER PUBLICATIONS

European Search Report for corresponding EP Application No. 23190756.9-1212 dated Jan. 25, 2024, 10 pages.

* cited by examiner

STRUCTURE AND METHOD FOR MEMORY ELEMENT TO CONFINE METAL WITH SPACER

TECHNICAL FIELD

Embodiments of the disclosure relate generally to circuit structures. More specifically, embodiments of the disclosure provide structures and methods for memory elements such as resistive random access memory (ReRAM).

BACKGROUND

Memory elements such as resistive random access memory (ReRAM) are an emerging and appealing sector of digital memory technology. ReRAM technology may use programmable elements of variable resistance to indicate high and low voltages. Data can be entered into resistive memory elements by changing their electrical resistance, and data can be read from the resistive memory elements by measuring a voltage drop across the element after it is programmed. A technical challenge associated with the forming of memory elements is the presence of residual material in portions of a device that do not include memory elements. Forming some types of memory elements will produce a metallic residue that, in some cases, my interfere with other circuitry for implementing logic or other functions.

SUMMARY

All aspects, examples and features mentioned herein can be combined in any technically possible way.

Embodiments disclosed herein provide a structure including: a memory element over a first portion of an insulator layer, wherein a portion of the memory element includes a sidewall over the insulator layer; a spacer adjacent the sidewall of the memory element and on the first portion of the insulator layer; and a metal-dielectric layer within one of an interface between the spacer and the sidewall and an interface between the spacer and the first portion of the insulator layer, wherein the insulator layer includes a second portion adjacent the first portion, and the second portion does not include the memory element, the spacer, and the metal-dielectric layer thereon.

Another aspect of the disclosure includes any of the preceding aspects, and wherein the memory element includes a resistive random access memory (ReRAM) stack.

Another aspect of the disclosure includes any of the preceding aspects, and wherein the metal-dielectric layer extends from the interface between the spacer and the sidewall to the interface between the spacer and the first portion of the insulator layer.

Another aspect of the disclosure includes any of the preceding aspects, and wherein the metal-dielectric layer is substantially L-shaped.

Another aspect of the disclosure includes any of the preceding aspects, and further including a logic circuit within the second portion of the insulator layer, wherein the first portion of the insulator layer does not include the logic circuit therein.

Another aspect of the disclosure includes any of the preceding aspects, and wherein the portion of the memory element includes a lower electrode of a resistive random access memory (ReRAM) stack, and an upper electrode of the ReRAM stack is above the lower electrode and the metal-dielectric layer.

Another aspect of the disclosure includes any of the preceding aspects, and wherein the spacer includes a hard masking material.

Embodiments disclosed herein provide a structure including: a resistive random access memory (ReRAM) stack including: a lower electrode over a first portion of an insulator layer, the lower electrode having a sidewall over the insulator layer, and an upper electrode over the lower electrode; a spacer adjacent the sidewall of the lower electrode and on the first portion of the insulator layer; and a metal-dielectric layer within one of an interface between the spacer and the sidewall and an interface between the spacer and the first portion of the insulator layer, wherein the insulator layer includes a second portion adjacent the first portion, and the second portion does not include the ReRAM stack, the spacer, and the metal-dielectric layer thereon.

Another aspect of the disclosure includes any of the preceding aspects, and wherein the metal-dielectric layer extends from the interface between the spacer and the sidewall to the interface between the spacer and the first portion of the insulator layer.

Another aspect of the disclosure includes any of the preceding aspects, and wherein the metal-dielectric layer is substantially L-shaped.

Another aspect of the disclosure includes any of the preceding aspects, and further including a logic circuit within the second portion of the insulator layer, wherein the first portion of the insulator layer does not include the logic circuit therein.

Another aspect of the disclosure includes any of the preceding aspects, and wherein the spacer includes a hard masking material.

Another aspect of the disclosure includes any of the preceding aspects, and wherein the upper electrode of the ReRAM stack is above the metal-dielectric layer.

Another aspect of the disclosure includes any of the preceding aspects, and wherein the spacer includes an outer sidewall opposite the metal-dielectric layer, the outer sidewall of the spacer being free of the metal-dielectric layer thereon.

Embodiments disclosed herein provide a method including: forming a memory element over a first portion of an insulator layer, wherein a portion of the memory element includes a sidewall over the insulator layer; forming a metal-dielectric layer on the insulator layer and the memory element; and forming a spacer adjacent the sidewall of the memory element and on the first portion of the insulator layer, wherein forming the spacer confines the metal-dielectric layer within one of an interface between the spacer and the sidewall and an interface between the spacer and the first portion of the insulator layer, and the insulator layer includes a second portion free of the memory element, the spacer, and the metal-dielectric layer thereon.

Another aspect of the disclosure includes any of the preceding aspects, and wherein forming the memory element includes forming a resistive random access memory (ReRAM) stack over the insulator layer.

Another aspect of the disclosure includes any of the preceding aspects, and wherein the spacer includes an outer sidewall opposite the metal-dielectric layer, the outer sidewall of the spacer being free of the metal-dielectric layer thereon.

Another aspect of the disclosure includes any of the preceding aspects, further including forming a logic circuit within the second portion of the insulator layer, wherein the first portion of the insulator layer does not include the logic circuit therein.

Another aspect of the disclosure includes any of the preceding aspects, and wherein forming the memory element includes: forming a lower electrode of the memory element; and forming an upper electrode of the memory element on the lower electrode, wherein the upper electrode includes: a dielectric layer on the lower electrode, and a conductive material on the dielectric layer and above the lower electrode, wherein the metal-dielectric layer is on a sidewall of one of the lower electrode and the upper electrode of the memory element.

Another aspect of the disclosure includes any of the preceding aspects, and wherein the spacer includes a hard masking material.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
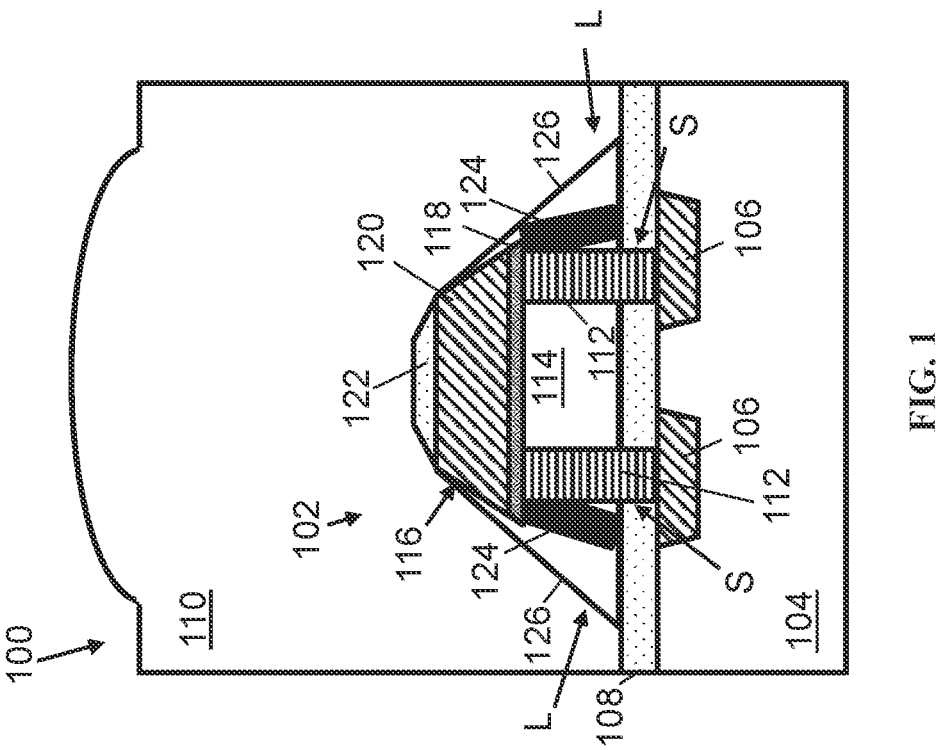
FIG. 1 shows a cross-sectional view of a structure including a memory element having a metal confined within a spacer according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

The disclosure provides a structure and method for a memory element to confine a metal (e.g., metallic residue) with a spacer. Metallic residues may be used to form and define various portions of a memory element, e.g., a resistive random access memory (ReRAM) stack, but also may impede the functionality of other types of memory elements, non-memory components such as digital logic, and/or other types of circuitry. The disclosure thus provides a structure and method to confine certain metals to specific locations of a product using a spacer, such that the metal is removed from other portions of the device. A structure according to the disclosure includes a memory element over a first portion of an insulator layer. A portion of the memory element includes a sidewall over the insulator layer. A spacer is adjacent the sidewall of the memory element and on the first portion of the insulator layer. A metal is within an interface between the spacer and the sidewall or an interface between the spacer and the first portion of the insulator layer. The insulator layer includes a second portion free of the memory element, the spacer, and the metal thereon.

RAM is a critical element for the operation of integrated circuit (IC) technology. RAM refers to any type of memory cell which is designed to store data temporarily. RAM may take a variety of forms, including static RAM ("SRAM") or dynamic RAM ("DRAM"). RAM may be implemented using a wide variety of circuit structures, electronic elements, and/or device architectures. The components of RAM provide a memory cell capable of electronically storing data in the form of a binary digit, i.e., a recorded high or low voltage to implement various types of logic. During operation, the memory cells in RAM must be configured for ease of writing information (i.e., storing high and low voltages) and reading information (i.e., identifying the stored voltage in a given cell).

ReRAM may be formed by using resistive memory elements such as memristors and/or other variable resistors whose resistance may change from high or low values upon experiencing a threshold electrical current. Resistive memory elements may include, e.g., a two-terminal electrical pathway formed by sets of conductive terminals separated by a thin layer of dielectric material. As current flows across the dielectric material from one terminal to the other, the current may cause ions to form within the dielectric alongside one of the terminals and thus change the resistance across the resistive memory element. The motion of oxygen ions and vacancies in the dielectric layer is analogous to the motion of electrons and holes in a semiconductor and may be used to encode high and low logic levels during the operation of a device. Alternatively, the formation of conductive path can also be achieved by forming metallic filaments in a dielectric material (e.g. silver (Ag), Tellurium (Te)). As discussed herein, multiple alternating layers of conductive material and dielectric material may be arranged in a stack. The conductive materials used to form the stack of a memory element such as ReRAM also may interfere with the operation of other structures on the same device.

Figure 2:
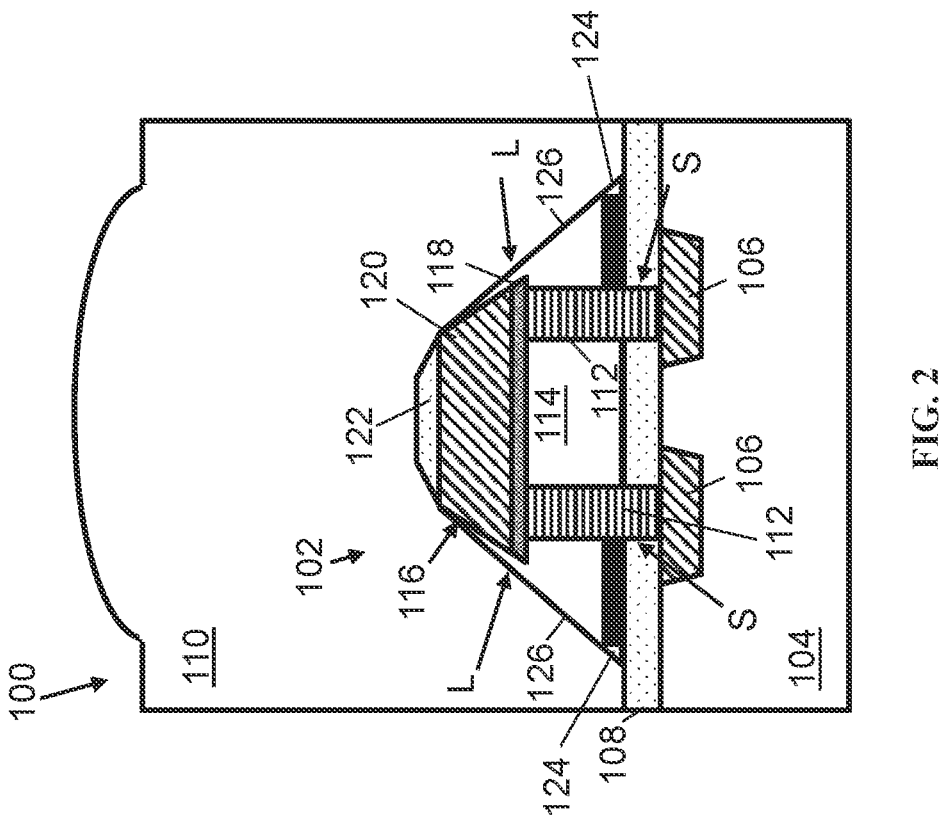
FIG. 2 shows a cross-sectional view of a structure including a memory element having a metal confined within a spacer according to further embodiments of the disclosure.

FIGS. 1 and 2 each depict a cross-sectional view of a structure 100 according to embodiments of the disclosure. Structure 100 may include a memory element 102 over an insulator layer 104. Insulator layer 104 may include any currently known or later developed dielectric substance, and as examples may include silicon nitride (Si3N4), silicon oxide (SiO2), fluorinated SiO2 (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), near frictionless carbon (NFC), a spin-on silicon-carbon containing polymer material available from JSR Corporation, other low dielectric constant (<3.9) material, or layers thereof.

To form structure 100, additional processing, e.g., back end of line (BEOL) processing, includes forming openings or recesses (not shown) within insulator layer 104 and filling the removed portions of insulator layer 104 with a conductive metal 106, e.g., copper (Cu), aluminum (Al), or other conductive wiring material(s) for interconnecting structure 100 to other components of a device. Before memory element 102 is formed, a barrier layer 108 such as an oxide layer or other dielectric material (e.g., one or more low-k films) may be formed on insulator layer 104 and cover conductive metal 106 to form a physical boundary between wiring within insulator layer 104 and one or more layers formed thereover. In some cases, barrier layer 108 may be part of insulator layer 104. An inter-level dielectric (ILD) layer 110 may be on barrier layer 108 and over memory element 102, e.g., to physically separate memory element 102 and other components within or on insulator 104 from overlying metal wiring layers. ILD layer 110 may have the same composition as insulator layer 104 or may have a different material composition. Moreover, insulator layer 104, barrier layer 108, and/or ILD layer 110 may be subdivided into multiple insulator layers having distinct compositions (e.g., various layers of oxide, nitride, and/or other insulative materials) in various implementations.

Memory element 102 of structure 100 may include, e.g., a resistive random access memory (ReRAM) stack. Memory element 102, in the case of a ReRAM stack, may operate by intentionally generating defects (e.g., oxide bond locations where oxygen has been removed) in a thin dielectric layer included within an electrode layer and/or located between two electrode layers. The two electrodes may be known as, and referred to as, a "lower electrode" and "upper electrode," respectively, and as further discussed herein. TIhe motion of oxygen ions and vacancies in the dielectric layer is analogous to the motion of electrons and holes in a semiconductor, and may be used to encode high and low logic levels during the operation of a device. Memory element 102 may include one or more lower electrodes 112 (e.g., two shown) each formed on one conductive metal 106 of insulator layer 104. Lower electrode(s) 112 may include, e.g., tantalum (Ta), tantalum nitride (TaN), titanium nitride (TiN), iridium (Ir), ruthenium (Ru), and/or similar metals, metal-nitride compounds, and/or other materials suitable for operation as portions of a memory element such as a ReRAM structure.

Initially, lower electrode(s) 112 may be formed by deposition within openings defined within ILD layer 110. Any portions of lower electrode 112 above a target height may be removed, e.g., by etching or planarization, to create lower electrode(s) 112 in a desired shape. According to one example, lower electrode(s) 112 may have a height of between approximately forty and fifty nm over insulator layer 104 and conductive metal 106. A dielectric support 114, e.g., including one or more dielectric materials discussed herein regarding insulator layer 104 and/or ILD layer 110, may be alongside lower electrode(s) 112 to provide a foundation for overlying conductive elements and/or to electrically separate lower electrodes 112 from each other.

Memory element 102 further may include an upper electrode 116 on lower electrode(s) 112 and dielectric support 114. Upper electrode 116 may have a different composition from lower electrode 112 and furthermore may include multiple distinct layers to provide data storage functions of memory element 102. For example, upper electrode 116 may include a dielectric layer 118 on lower electrode 112 and dielectric support 114, and a conductive material 120 on dielectric layer 118. Dielectric layer 118 may include, e.g., a thin layer of dielectric material. Such materials may include, e.g., silicon dioxide, silicon nitride, hafnium oxide, tantalum oxide, and/or other materials in a layer having a thickness of approximately three nanometers (nm). Conductive material 120 may include one or more layers of conductive materials and may include a stack of such materials in the case of ReRAM. For instance, conductive material 120 may include a relatively thin layer (e.g., approximately four to twenty nm) of an anode alloy material beneath a relatively thick layer (e.g., approximately fifty nm vertical thickness) of tantalum, tantalum nitride (TaN), and/or other alloys based in tantalum or other metals. However embodied, conductive material 120 being separated from lower electrode 112 by dielectric layer 118 may enable ions to form within dielectric layer 118 alongside lower electrode 112 or conductive material 120, thus changing the resistance across memory element 102. In other implementations, upper electrode 116 may include multiple alternating layers of dielectric materials and conductive materials, and/or such alternating layers may instead be within lower electrode 112 (e.g., in other types of memory structure architectures). Memory element 102 additionally may have an insulative cap 122, e.g., formed of masking material and/or other insulators, to protect against physical and chemical interference from overlying materials (e.g., ILD layer 110 and/or other materials formed thereon).

The forming of upper electrode 116, e.g., conductive material 120 thereof, may include forming a layer of metal (e.g., hafnium or tantalum). The layer of metal may be processed, e.g., by depositing and etching, to form one or more electrodes within memory element 102 as discussed herein. Such metals, when formed on structures or areas other than memory element 102, may pose a risk of operational interference with other structures or devices by creating conductive pathways where they are not desired. Embodiments of structure 100 mitigate or prevent such risks by confining such metals and/or metal residues to locations within structure 100. Structure 100 may include, e.g., a metal-dielectric layer 124 that is adjacent memory element 102 (e.g., lower electrode 112 and/or upper electrode 116) or over insulator layer 104. Metal-dielectric layer 124 may be, e.g., metallic residues on a dielectric material or a process-induced intermixing of metallic material from memory element 102 (e.g., RRAM stack) formation with dielectric material(S). The residues or the intermixing may be a result of the patterning process(es) to form such materials, e.g., reactive ion etch, sputter etch, ion beam etch, etc. Thus, metal-dielectric layer 124 may be a remaining portion of a metal residue that is removed from other portions of insulator layer 104. Metal-dielectric layer 124 may include a mix of metal and dielectric materials confined within the composition of a spacer 126 thereon as discussed herein. More specifically, metal-dielectric layer 124 may be located within and/or may define the physical interface between a sidewall S of memory element 102 and spacer(s) 126 formed of, e.g., one or more dielectric materials. In some cases, e.g., as depicted in FIG. 1, metal-dielectric layer 124 may be horizontally between memory element 102 and spacer 126. In other cases, e.g., as depicts in FIG. 2, metal-dielectric layer 124 may be located within and/or may define the physical interface between insulator layer 104 or barrier layer 108 and spacer 126. In further implementations, metal-dielectric layer 124 may extend from a first end vertically between insulator layer 104 and spacer 126 to an opposite end horizontally between memory element 102 and spacer 126. Although metal-dielectric layer 124 is shown in an extended configuration in FIGS. 3-5, this is not necessarily required in all implementations and the configuration of metal-dielectric layer 124 shown in FIGS. 1 and 2 may be used.

Spacers 126 may have the same composition and/or similar compositions to other insulative materials discussed herein (e.g., oxide-based or nitride-based insulative materials, and/or other materials included within insulator layer 104, barrier layer 108, ILD layer 110, dielectric support 114, etc.) and may be prevent conductive pathways from forming to any components that are adjacent to memory element 102. In some implementations, metal-dielectric layer 124 may be substantially "L-shaped" by including a horizontally extending portion between insulator layer 104 and spacer 126, and by including a generally vertically extending portion between sidewall S and spacer 126. In still further examples, an upper surface of metal-dielectric layer 124 may intersect with upper electrode 116 and/or adjacent portions of spacer 126. However embodied, metal-dielectric layer 124 may be confined within spacer 126, i.e., no surface of metal-dielectric layer 124 is adjacent or and/or in contact with ILD layer 110 due to metal-dielectric layer 124 being wholly contained within spacer 126. Spacer(s) 126 thus may include one or more outer sidewalls L that are free of metal-dielectric layer 124 material thereon. Spacer 126 may confine metal-dielectric layer 124 therein, e.g., because spacer 126 may be formed over metal-dielectric layer 124 before portions of metal located outside memory element 102 are removed as discussed herein.

Figure 3:
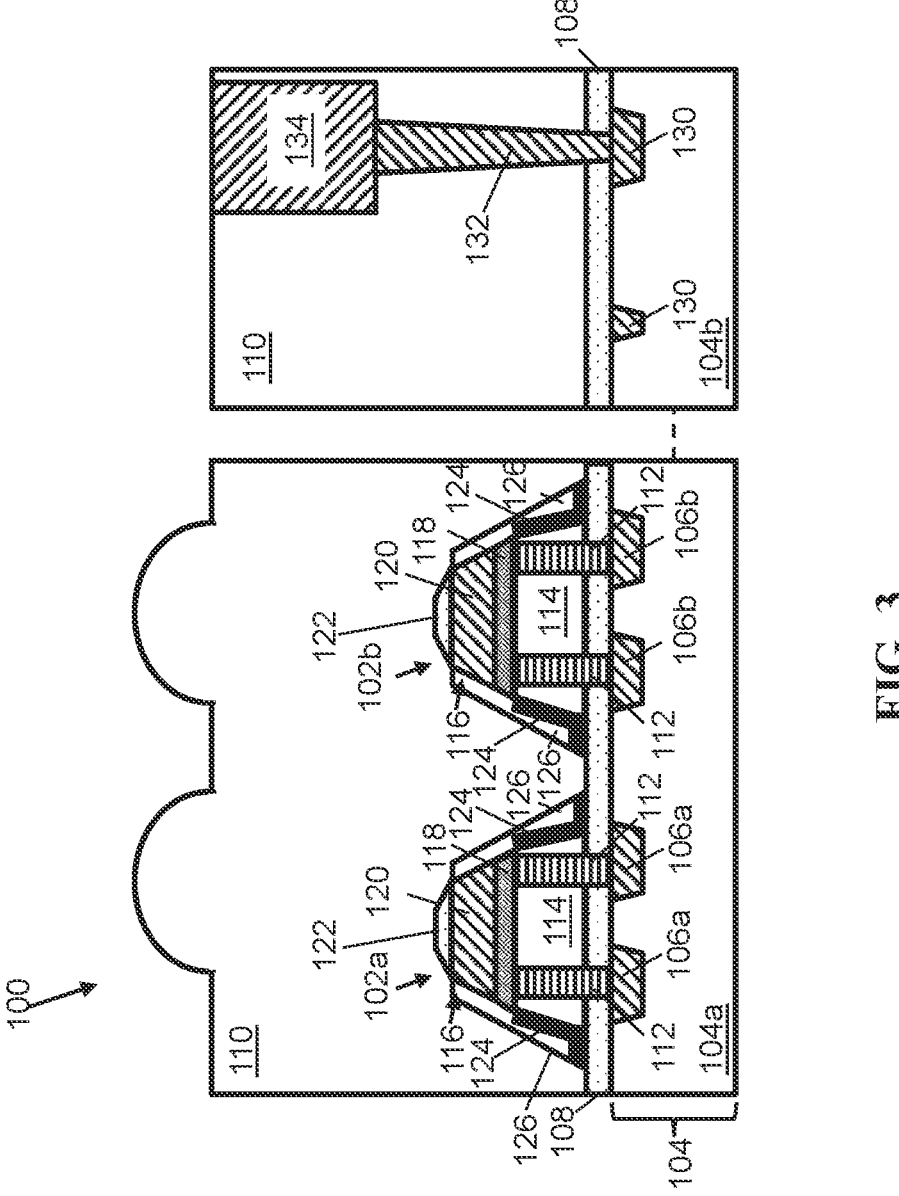
FIG. 3 shows a cross-sectional view of a multiple structures on a same device as a logic circuit according to embodiments of the disclosure.

Referring to FIG. 3, structure 100 may allow metal-dielectric layer 124 to be confined within spacers 126. Thus, other components of the same device may be free of metal-dielectric layer 124 thereover. Insulator layer 104 (FIGS. 1, 2) may be subdivided into a first portion 104a having one or more memory elements 102 (separately identified as 102a, 102b in FIG. 3) thereover, and a second portion 104b located elsewhere in structure 100. First portion 104a is separated from second portion 104b by dashed lines to denote an indeterminate length; insulator layer 104 may have several additional portions located between first portion 104a and second portion 104b or portions 104a, 104b may be directly adjacent. Second portion 104b may include non-memory elements, e.g., logic circuitry, for implementing other functions of a device. For instance, a set of logic components 130 may be within second portion 104b and are depicted by example as metal blocks extending into or out of the plane of the page. A via 132 (i.e., a vertically extending conductor) may be over one or more logic components 130 to overlying conductors 134 through ILD layer 110. Due to metal-dielectric layer 124 being confined by spacer 126 over first portion 104a, second portion 104b and components formed therein (e.g., logic components 130) may be free of metal-dielectric layer 124 thereover. Thus, structure 100 allows metal-dielectric layer 124 to be present where needed to define operating components of memory element(s) 102 but prevents metal-dielectric layer 124 from being present or retained in areas where it may negatively affect the operation of other structures such as logic component(s) 130.

Figure 4:
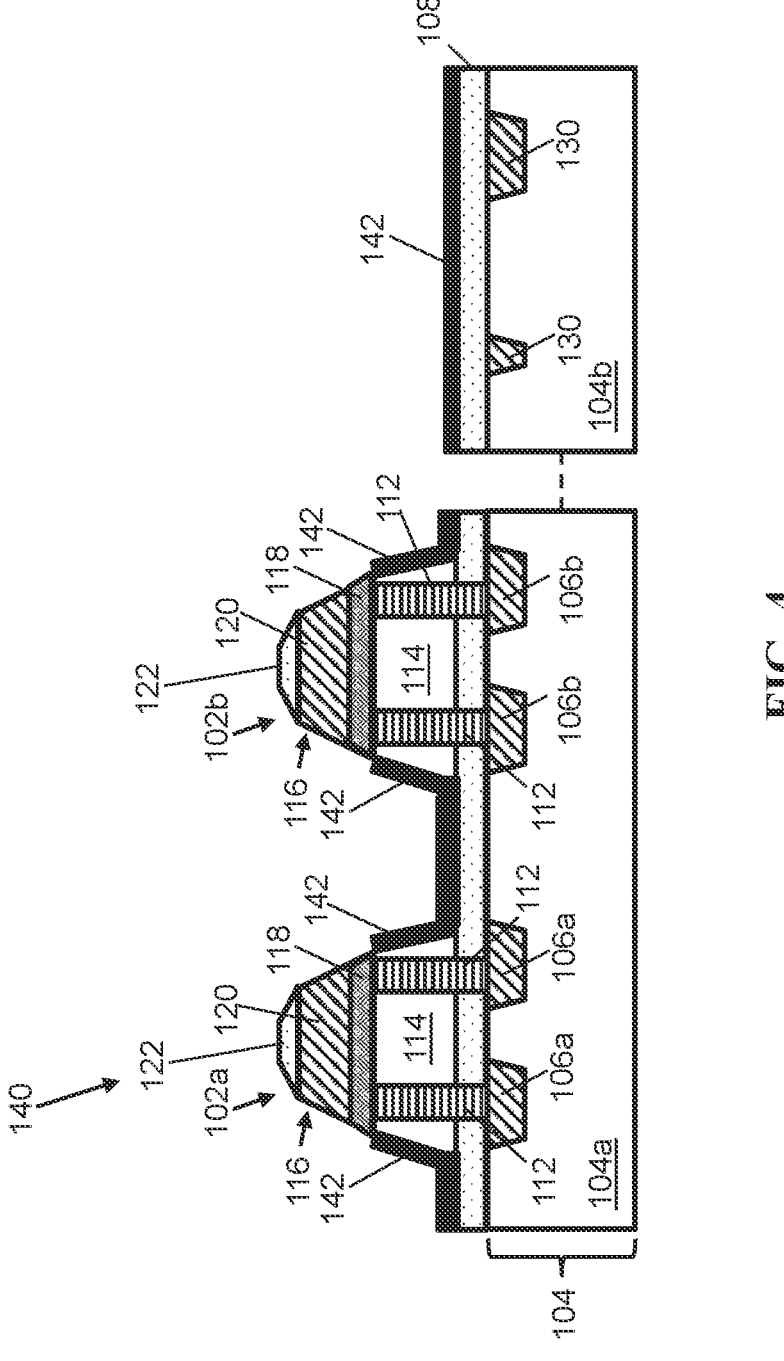
FIG. 4 shows a cross-sectional view of an initial structure with a memory element and metal residue before processing according to the disclosure.

Referring to FIG. 4, methods of the disclosure provide various processes to yield structure 100 in which spacer 126 confines metal-dielectric layer 124 over first portion 104a as discussed herein. FIG. 4 depicts a preliminary structure 140 including, e.g., two pairs of ReRAM stacks with each pair being in a respective memory element 102a, 102b. The forming of each memory element 102a, 102b may include, e.g., forming lower electrode 112 and forming upper electrode 116 on lower electrode 112. Upper electrode 116 moreover may include dielectric layer 118 on lower electrode 112 and conductive material 120 on dielectric layer 118. Preliminary structure 140 may be formed before ILD layer 110 and any materials or components therein are formed over memory elements 102a, 102b, and logic components 130 and/or any other components on or within insulator layer 104. The forming of memory elements 102a, 102b (including electrodes 112, 116 thereof) may involve forming one or more metals (e.g., Hf or Ta as discussed herein) as a layer over first portion 104a of insulator layer 104. The forming of such metals may create a layer of metal residue 142 over each portion 104a, 104b, e.g., due to the metal deposition and etching processes used to form electrodes 112, 116. Metal residue 142, if left intact over second portion 104b, may interfere with the operation of logic component(s) 130 or other structures within or on second portion 104b. However, metal residue 142 cannot be removed at this phase of processing because it may also be removed from memory elements 102a, 102b, thus preventing memory elements 102a, 102b from functioning according to specifications. Embodiments of the disclosure allow metal residue to be confined within a spacer over first portion 104a before it is removed from second portion 104b and/or other areas of a device.

Figure 5:
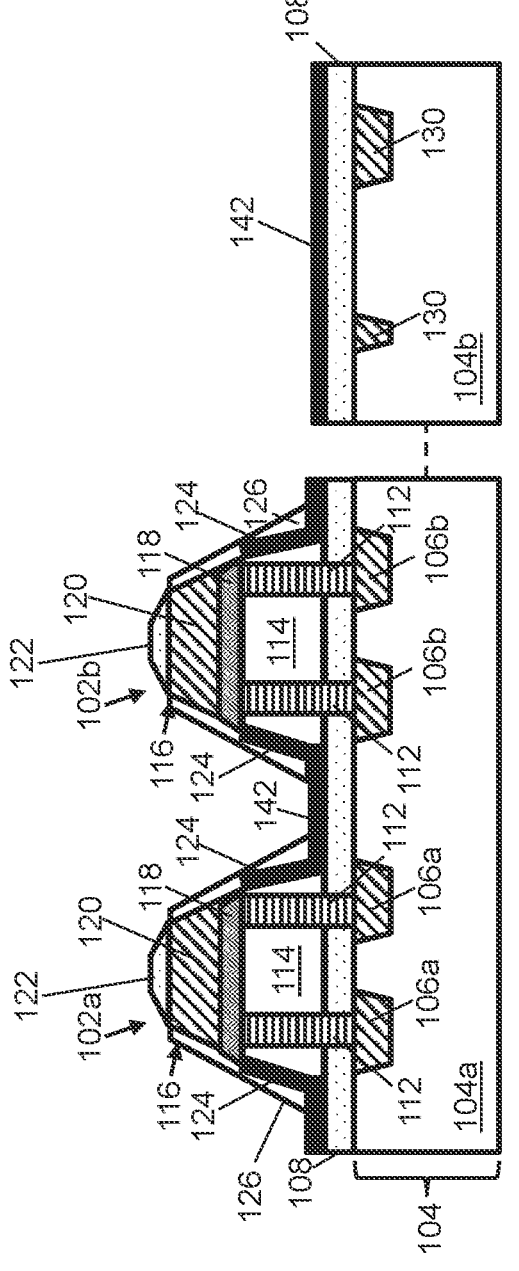
FIG. 5 shows a cross-sectional view of forming a spacer on the structure according to embodiments of the disclosure.

Turning to FIG. 5, methods of the disclosure include forming spacer(s) 126 over memory element(s) 102a, 102b and insulator layer 104 to confine portions of metal residue 142 within spacer(s) 126 as metal-dielectric layer 124. To form spacer(s) 126, embodiments of the disclosure may include depositing a layer of insulator (e.g., a hard masking material such as tetraethyl orthosilicate (TEOS) based silicon oxide) over memory elements 102a, 102b and insulator layer 104. The deposited insulator may have a predetermined height, e.g., one-hundred nm above memory element(s) 102a, 102b and insulator layer 104 where applicable, such that a contour of the deposited material substantially imitates the contour of the material(s) thereunder. Continued processing may include, e.g., performing reactive ion etching (RIE) and/or other types of etching, such that spacer(s) 126 are formed alongside memory element(s) 102a, 102b but do not remain intact over other areas of first portion 104a and/or over second portion 104b of insulator layer 104. In the case of RIE, the etching may remove some portions or perhaps a majority of metal residue 142, e.g., such that the thickness of metal residue 142 is reduced after the etching concludes. However, a significant amount of metal residue 142 nonetheless may remain above insulator layer 104. As a result of forming spacer(s) 126, metal-dielectric layer 124 may be confined within spacer(s) 126 and thus may occupy or define an interface between spacer(s) 126 and insulator layer 104, barrier layer 108, and/or electrode(s) 112, 116 of memory element 102a, 102b. Other portions of metal residue 142 may remain on areas of insulator layer 104 that spacers 126 do not cover.

Figure 6:
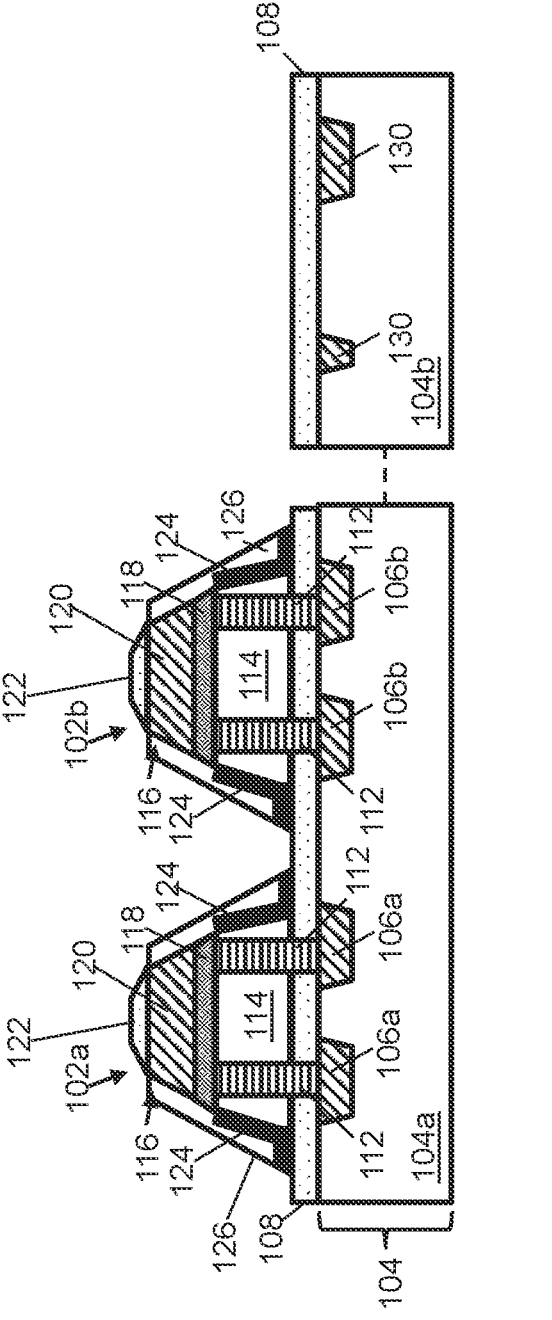
FIG. 6 shows a cross-sectional view of removing some metal residue while confining other metal within the spacer according to embodiments of the disclosure.

Referring now to FIG. 6, continued processing may include removing metal residue 142 from insulator layer 104 and/or barrier layer 108, e.g., by wet etching and/or selective etching or removal techniques. Hydrofluoric acid (dHF) etching in particular may remove metal residue 142 (FIGS. 4, 5) without affecting the composition or operability of memory element(s) 102a, 102b due to the presence of spacer(s) 126 and insulative cap 122, protecting various materials thereunder from contacting any selective etching material(s). The removing of metal residue 142 may expose the outermost surfaces of memory elements 102a, 102b and insulator layer 104 (and barrier film 108 thereover). Any remaining metal-dielectric layer 124 is confined within spacers 126, e.g., due to the forming of spacers 126 when metal residue 142 was present over insulator layer 104. At this stage of processing, ILD layer 110 may be formed over memory elements 102a, 102b to form structure 100 as discussed herein.

Embodiments of the disclosure provide various technical and commercial advantages, examples of which are discussed herein. Embodiments of structure 100 confine metal-dielectric layer 124 within spacers 126 to prevent the same metal(s) from interfering with logic functions and/or other devices located outside first portion 104a of insulator layer 104. The processes to confine metal-dielectric layer 124 within spacers 126, moreover, are compatible with multiple approaches to form and define memory elements 102 (e.g., ReRAM stacks or similar structures) within a device. Further, the present disclosure may reduce the risk of contamination from metal-dielectric layer 124 in subsequent processing of the structure to form vias and/or metal wiring layers. The present disclosure also allows sidewall(s) S of memory element(s) 102a, 102b, etc., to be encapsulated within a relatively dense dielectric material via spacer(s) 126, rather than being encapsulated with porous dielectric materials and/or other components that are more porous than the material(s) suitable to form spacer(s) 126.

It should be understood that in the method and structures described above, a semiconductor material refers to a material whose conducting properties can be altered by doping with an impurity. Illustrative semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The integrated circuit chips including the structure can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
a memory element over a first portion of an insulator layer, wherein a portion of the memory element includes a sidewall over the insulator layer, wherein the portion of the memory element includes a lower electrode, and an upper electrode above the lower electrode;
a spacer adjacent the sidewall of the memory element and on the first portion of the insulator layer; and
a metal-dielectric layer within one of an interface between the spacer and the sidewall and an interface between the spacer and the first portion of the insulator layer, wherein the upper electrode is above the metal-dielectric layer and the insulator layer includes a second portion adjacent the first portion, and the second portion does not include the memory element, the spacer, and the metal-dielectric layer thereon.

2. The structure of claim 1, wherein the memory element includes a resistive random access memory (ReRAM) stack.

3. The structure of claim 1, wherein the metal-dielectric layer extends from the interface between the spacer and the sidewall to the interface between the spacer and the first portion of the insulator layer.

4. The structure of claim 3, wherein the metal-dielectric layer is substantially L-shaped.

5. The structure of claim 1, further comprising a logic circuit within the second portion of the insulator layer, wherein the first portion of the insulator layer does not include the logic circuit therein.

6. The structure of claim 1, wherein the spacer includes a hard masking material.

7. A method comprising:
forming a memory element over a first portion of an insulator layer, wherein a portion of the memory element includes a sidewall over the insulator layer and forming the memory element includes:

forming a lower electrode of the memory element, and forming an upper electrode of the memory element on the lower electrode;
forming a metal-dielectric layer on the insulator layer and the memory element, wherein the upper electrode is above the metal-dielectric layer; and
forming a spacer adjacent the sidewall of the memory element and on the first portion of the insulator layer, wherein forming the spacer confines the metal-dielectric layer within one of an interface between the spacer and the sidewall and an interface between the spacer and the first portion of the insulator layer, and the insulator layer includes a second portion free of the memory element, the spacer, and the metal-dielectric layer thereon.

8. The method of claim 7, wherein forming the memory element includes forming a resistive random access memory (ReRAM) stack over the insulator layer.

9. The method of claim 7, wherein the spacer includes an outer sidewall opposite the metal-dielectric layer, the outer sidewall of the spacer being free of the metal-dielectric layer thereon.

10. The method of claim 7, further comprising forming a logic circuit within the second portion of the insulator layer, wherein the first portion of the insulator layer does not include the logic circuit therein.

11. The method of claim 7,
wherein the upper electrode includes:
a dielectric layer on the lower electrode, and
a conductive material on the dielectric layer and above the lower electrode,
wherein the metal-dielectric layer is on a sidewall of the lower electrode.

12. The method of claim 7, wherein the spacer includes a hard masking material.

13. A structure comprising:
a memory element over a first portion of an insulator layer, wherein a portion of the memory element includes a sidewall over the insulator layer;
a spacer including a hard masking material, adjacent the sidewall of the memory element and on the first portion of the insulator layer; and
a metal-dielectric layer within one of an interface between the spacer and the sidewall and an interface between the spacer and the first portion of the insulator layer, wherein the insulator layer includes a second portion adjacent the first portion, and the second portion does not include the memory element, the spacer, and the metal-dielectric layer thereon.

14. The structure of claim 13, wherein the memory element includes a resistive random access memory (ReRAM) stack.

15. The structure of claim 13, wherein the metal-dielectric layer extends from the interface between the spacer and the sidewall to the interface between the spacer and the first portion of the insulator layer.

16. The structure of claim 15, wherein the metal-dielectric layer is substantially L-shaped.

17. The structure of claim 13, further comprising a logic circuit within the second portion of the insulator layer, wherein the first portion of the insulator layer does not include the logic circuit therein.

18. The structure of claim 13, wherein the portion of the memory element includes a lower electrode of a resistive random access memory (ReRAM) stack, and an upper electrode of the ReRAM stack is above the lower electrode and the metal-dielectric layer.

* * * * *